US012564081B2

(12) United States Patent
Oikawa

(10) Patent No.: US 12,564,081 B2
(45) Date of Patent: Feb. 24, 2026

(54) ELECTRONIC DEVICE AND SEMICONDUCTOR DEVICE WITH WIRING FROUPS FOR PARALLEL SIGNAL TRANSMISSION

(71) Applicant: RENESAS ELECTRONICS CORPORATION, Tokyo (JP)

(72) Inventor: Ryuichi Oikawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 579 days.

(21) Appl. No.: 18/074,265

(22) Filed: Dec. 2, 2022

(65) Prior Publication Data

US 2024/0186255 A1 Jun. 6, 2024

(51) Int. Cl.
| | |
|---|---|
| *H01L 23/538* | (2006.01) |
| *H01L 25/065* | (2023.01) |
| *H04L 7/00* | (2006.01) |
| *H04L 25/03* | (2006.01) |
| *H10B 12/00* | (2023.01) |

(52) U.S. Cl.
CPC ...... *H01L 23/5386* (2013.01); *H01L 25/0655* (2013.01); *H04L 7/0079* (2013.01); *H04L 25/03878* (2013.01); *H10B 12/00* (2023.02)

(58) Field of Classification Search
None
See application file for complete search history.

(56) References Cited

U.S. PATENT DOCUMENTS

| | | | |
|---|---|---|---|
| 7,745,915 B2 | 6/2010 | Suwa et al. | |
| 2011/0199737 A1* | 8/2011 | Yonehara | H01L 23/49838 |
| | | | 361/728 |
| 2016/0226734 A1* | 8/2016 | Pandey | H04B 3/462 |
| 2018/0183411 A1* | 6/2018 | Oikawa | H01L 23/647 |

* cited by examiner

*Primary Examiner* — Kretelia Graham
*Assistant Examiner* — William Henry Anderson
(74) *Attorney, Agent, or Firm* — Rimon P.C.

(57) ABSTRACT

An electronic device includes: a first semiconductor device having a plurality of transmitting units; a second semiconductor device having a plurality of receiving units; and a plurality of wirings coupling between the plurality of transmitting units and the plurality of receiving units and also transmitting a data signal from the plurality of transmitting units to the plurality of receiving units. Here, the plurality of wirings has: a plurality of first wirings each having a signal delay that is divisible by a half of a time of the data signal; and a plurality of second wirings each having a signal delay that is not divisible by the half of the time of the data signal. The plurality of first wirings is arranged at a first wiring interval. Also, the plurality of second wirings is arranged at a second wiring interval wider than the first wiring interval.

12 Claims, 18 Drawing Sheets

$S_A : S_B = 0.7 : 1.0$

ELECTRONIC DEVICE AND SEMICONDUCTOR DEVICE WITH WIRING FROUPS FOR PARALLEL SIGNAL TRANSMISSION

BACKGROUND

The present invention relates to an electronic device and a semiconductor device, and more particularly, to an electronic device and a semiconductor device employing a parallel signal transmission that transmits a plurality of signals in parallel.

For example, there is a semiconductor device including a substrate on which a semiconductor chip (hereinafter, also referred to as a memory chip) of a DRAM (Dynamic Random Access Memory) and a semiconductor chip (hereinafter, also referred to as a microcomputer chip) of a microcomputer are mounted. When the microcomputer chip reads out, for example, a data signal from the memory chip, the microcomputer chip supplies a command signal to the memory chip, and the memory chip supplies the data signal to the microcomputer chip in response to the supplied command signal. Here, each of the command signal and the data signal is constituted by a plurality of signals. Also, the plurality of signals is transmitted in parallel via a plurality of wirings formed in the substrate on which the microcomputer chip and the memory chip are mounted. That is, the command signal and the data signal are transmitted between the microcomputer chip and the memory chip by the parallel signal transmission. Incidentally, the semiconductor chip is also referred to as a semiconductor die.

Here, there are disclosed techniques listed below.

[Patent Document 1] Japanese Unexamined Patent Application Publication No. 2006-237385

A semiconductor device including a memory chip and a microcomputer chip both mounted on the same substrate is disclosed in, for example, Patent Document 1.

SUMMARY

A process can be accelerated by increasing a transmission rate of the parallel signal transmission at, for example, 6.4 Gbps. However, a signal quality deteriorates due to an inter-signal interference (crosstalk) by increasing the transmission rate. In order to reduce the deterioration of signal quality due to crosstalk, it is conceivable to sufficiently separate an interval (wiring interval) between adjacent wirings of a plurality of wirings used for the parallel signal transmission. Alternatively, it is conceivable to insert a shield wiring to which a predetermined voltage such as a ground voltage is to be supplied between the adjacent wirings.

In case of adopting a measure that, for example, increases the wiring interval in order to reduce the deterioration of the signal quality, it is required to increase the wiring interval as the transmission rate increases. As a consequence, the area of a wiring region, which is to be occupied with wirings, in substrate is to be increased, thereby the cost of the substrate is to be increased. In order to prevent the wiring region from becoming large and to reduce the size of the wiring region, it is conceivable to form the wirings in a three-dimensional manner by increasing the number of wiring layers for forming the wirings in the substrate. However, in case of increasing the number of the wiring layers, the cost of the substrate is to be increased. Similarly, in case of adopting a measure that inserts the shield wiring, the area of the wiring region is to be increased, or the number of the wiring layers is to be increased.

In other words, any of the measures hinders the cost-reduction of a semiconductor device (and an electronic device as well).

According to one embodiment, a semiconductor device and an electronic device, which are capable of achieving the cost-reduction while achieving an increase of the transmission rate, are to be provided.

Other objects and novel features will become apparent from the description of this specification and the accompanying drawings.

An electronic device according to one embodiment, includes: a substrate; a first semiconductor device mounted on the substrate and having a plurality of transmitting units; a second semiconductor device mounted on the substrate and having a plurality of receiving units; and a plurality of wirings formed in the substrate, coupling between the plurality of transmitting units and the plurality of receiving units, and also transmitting a data signal from a corresponding one of the plurality of transmitting units to a corresponding one of the plurality of receiving units. Here, the plurality of wirings has: a first wiring group; and a second wiring group different from the first wiring group. The first wiring group has a plurality of first wirings each having a signal delay that is divisible by a half of a time of the data signal. The second wiring group has a plurality of second wirings each having a signal delay that is not divisible by the half of the time of the data signal. The plurality of first wirings is arranged in the substrate at a first wiring interval. Also, the plurality of second wirings is arranged in the substrate at a second wiring interval wider than the first wiring interval.

DETAILED DESCRIPTION

Figure 1A:
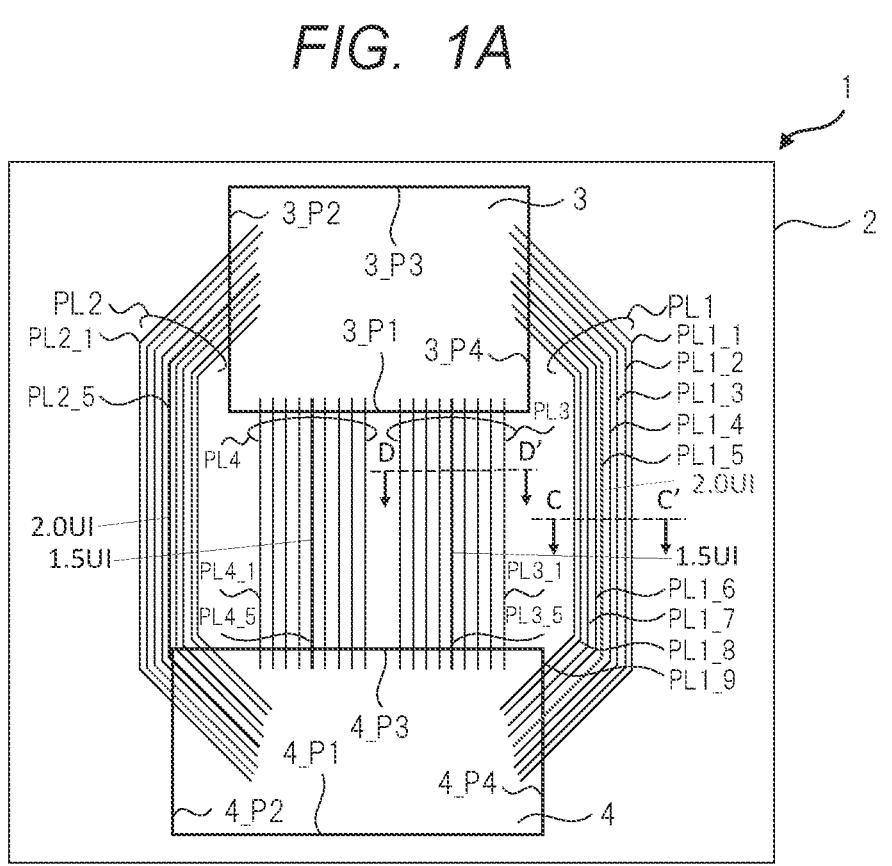
FIGS. 1A and 1B are a plan view and a cross-sectional view, respectively, each showing a configuration of an electronic device according to a first embodiment.

Hereinafter, embodiments of the present invention are described in detail with reference to the drawings. In all the drawings for describing the embodiments, the same parts are denoted by the same reference numerals in principle, and repeated descriptions thereof will be omitted.

A plurality of embodiments will be described below, and before that, in order to facilitate understanding of the embodiments, wiring interval rules for a plurality of wirings used in the parallel signal transmission and a phenomenon found by the present inventor will be described.

<Wiring Interval Rules>

A plurality of semiconductor chips (or a plurality of semiconductor device) is mounted on a substrate, and a plurality of wirings is arranged on the same substrate to perform parallel signaling between the semiconductor chips (semiconductor device). By increasing the number of wiring layers formed on the substrate, the area of the wiring area on the substrate can be reduced when viewed in a plan view. However, in order to prevent degradation of signal quality due to crosstalk, it is required to set an appropriate wiring interval regardless of the number of wiring layers. A wiring interval rule for determining an appropriate wiring interval is determined, for example, as follows.

First, a tentative wiring interval rule is set within a range permitted for manufacturing, a wiring is arranged on the substrate at a wiring interval according to the wiring interval rule, and a signal wiring model is generated from the finished artwork by, for example, electromagnetic field analysis. This signal wiring model is used to perform signal transmission analysis (e.g., transmitting a signal at a transmission rate 6.4 Gbps and analyzing the transmitted signal), and if desired performance (e.g., desired signal qualities) is not obtained, then the wiring interval rules are updated to increase the wiring interval and artwork is modified. This operation is repeated for all the wirings so that all the signals have the desired performance.

Taking the microcomputer chip and the memory chip as an example, in general, the command signal and the data signal are different in transmission speed, so that the wiring for transmitting the command signal and the wiring for transmitting the data signal, by repeating the operation described separately, it is possible to set a separate wiring interval rule, it is possible to suppress the wiring region from becoming large.

By repeating the above-described operation, the wiring interval rule is uniformly set for each wiring that transmits data signals at the same transmission rate or for all wiring lines. In this case, the wiring interval rule corresponding to the signal having the worst condition, for example, the signal having the worst signal quality, controls the entire wiring interval.

Since the total number of wirings connecting the semiconductor chips and the like is determined in advance, when the wiring interval rule is set, the number of wiring layers and the area of the wiring region, which are required to form the total number of wirings determined in advance, are basically determined. That is, since the area of the wiring region is determined by the set wiring interval rule, the wiring width, and the number of wirings, the product of the number of wiring layers and the area of the wiring region is determined by the total number of wirings. In other words, when the total number of wirings is determined, the number of wiring layers and the area of the wiring region have a trade-off relationship.

Further, since it is necessary to increase the wiring interval so as to reduce the deterioration of the signal quality due to the crosstalk as the transmission rate increases, there is a fact that the product of the number of wiring layers and the area of the wiring region increases. As described above, an increase in the number of wiring layers leads to an increase in the cost of the substrate, and an increase in the area of the wiring area hinders a reduction in the size of the substrate and leads to an increase in the cost of the substrate. Since the number of wiring layers and the wiring region have a trade-off relationship, even if the number of wiring layers is reduced or the wiring region is miniaturized, the cost is increased. In particular, the higher the transmission rate, the greater the cost increase.

<Phenomenon Found by Present Inventor>

The present inventors have studied the effects of crosstalk. The present inventors have found that the signal delay in the wiring changes the influence of the crosstalk, and there is periodically an optimum signal delay capable of reducing the influence of the crosstalk. By using this phenomenon, it is possible to reduce the influence of the crosstalk by adjusting the length of the wiring used in the parallel signal transmission to a length that is close to the optimum signal delay. Since the influence of the crosstalk can be reduced, the wiring interval can be reduced, and for example, the area of the wiring region can be reduced. As a result, the trade-off described above can be relaxed. Here, the signal delay is the product of the length of the wiring that transmits the signal, that is, the wiring length, and the delay time of the signal required to propagate the unit length of the wiring.

Next, the phenomenon found by the present inventor will be described with reference to the drawings.

«Data Signal»

First, the meaning of the data signal used in the present specification will be described. The data signal means one signal transmitted through one wiring in the parallel signal transmission.

Figure 5:
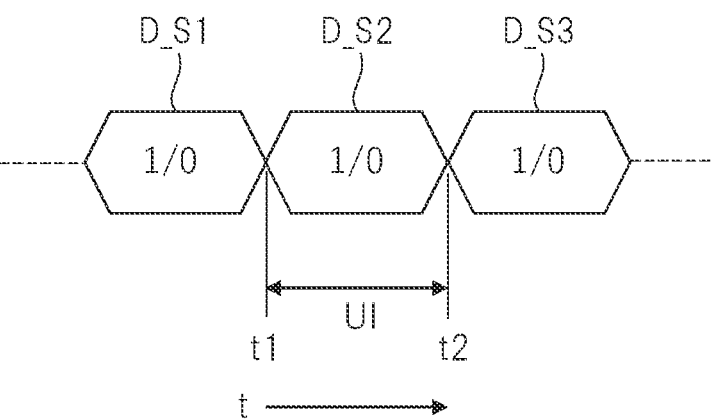
FIG. 5 is a diagram for explaining a data signal.

FIG. 5 is a diagram for explaining a data signal. FIG. 5 shows a schematic waveform of the three data signals D_S1, D_S2, and D_S3 supplied from the transmitting unit to the wiring with the passage of time t. I/O indicated in the data signals D_S1, D_S2, D_S3 indicates a logical value of a binary ("1" or "0") output by the transmitting unit, and the waveforms of the data signals D_S1, D_S2, D_S3 change to a high-level or low-level waveform according to the logical value. In the drawing, UIs (Unit interval) indicate a time (hereinafter, also referred to as data signal time) of one data signal transmitted from a transmitting unit. For example, the waveform of the data signal D_S2 transitions to the level according to the logical value corresponding to the data signal D_S2 at the time t1 after the data signal D_S1 is output, and transitions toward the waveform of the data signal D_S3 at the subsequent time t2. The times t1 and t2 can be regarded as the time at which the value of the waveform of the data signal reaches the threshold value for identifying the high level and the low level. The time between the time t1 and the time t2 is the data signal time UI. Note that in one parallel signal transmission, the time (data signal time UI) of the data signal in each of the plurality of wirings is all the same.

«Phenomenon and Rationale»

FIG. 6, FIG. 7A, FIG. 7B, and FIG. 8 are diagrams for explaining phenomena found by the present inventors.

Figure 6:
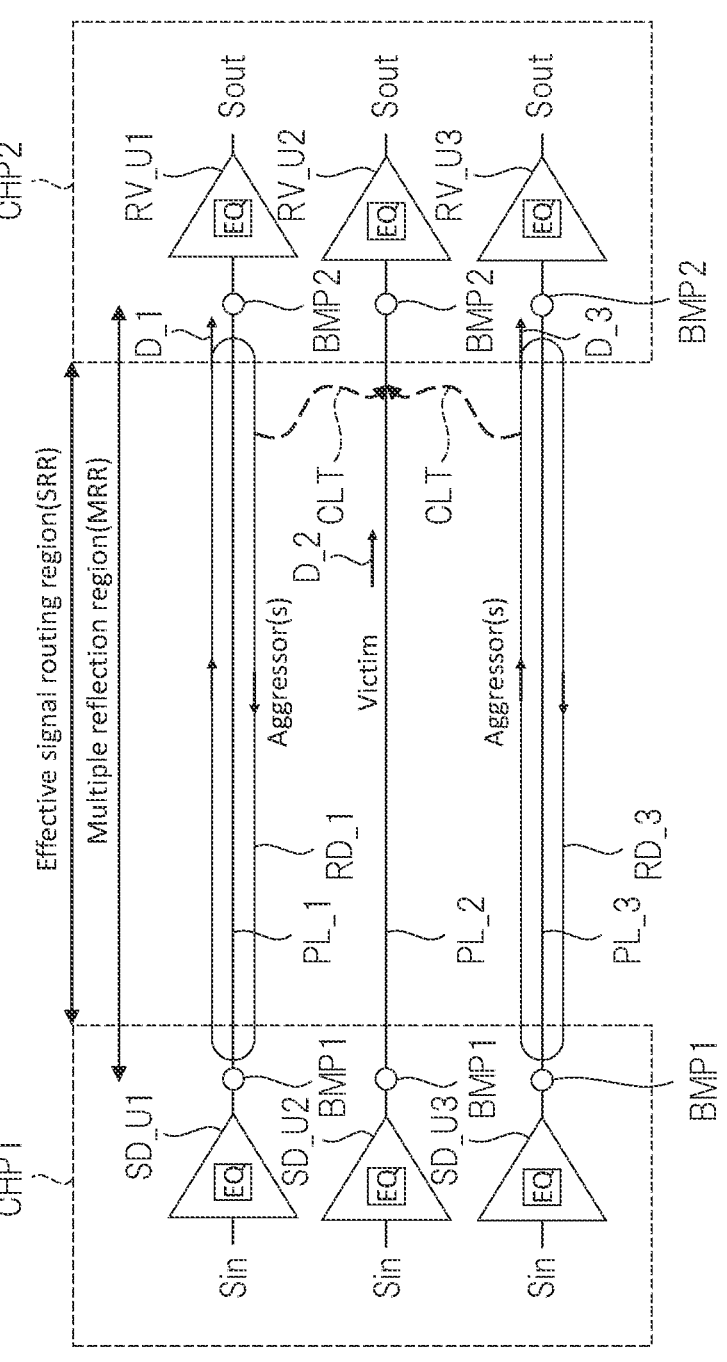
FIG. 6 is a diagram for explaining a phenomenon found by the present inventor.

In FIG. 6, each of "CHP1" and "CHP2" indicates a semiconductor chip. For example, the semiconductor chip CHP1 is comprised of a microcomputer chip, and the semiconductor chip CHP2 is comprised of a memory chip. The semiconductor chips CHP1 and CHP2 include a plurality of input/output units. Each of the input/output units includes a transmitting unit and a receiving unit. In FIG. 6, only the transmitting units SD_U1 to SD_U3 provided in the semiconductor chip CHP1 and the receiving units RV_U1 to RV_U3 provided in the semiconductor chip CHP2 are shown among the plurality of input/output units for ease of explanation.

The semiconductor chips CHP1 and CHP2 are mounted on the same substrate, and the wirings PL_1 to PL_3 for the parallel-signal transmission between semiconductor chips CHP1 and CHP2 are arranged on the same substrate.

The output of the transmitting units SD_U1 to SD_U3 is coupled to the bump electrode BMP1 connected to one end of the corresponding wirings PL_1 to PL_3. The input of the receiving units RV_U1 to RV_U3 is coupled to the bump electrodes BMP2 connected to the other end of the corresponding wiring PL_1 to PL_3. An input signal Sin is supplied to the transmitting units SD_U1 to SD_U3, and the transmitting units SD_U1 to SD_U3 supply an output signal in accordance with the input signal Sin to the wiring PL_1 to PL_3 via the bump electrode BMP1 as a data signal D_1 to D_3.

Since the parallel signal transmission is adopted, the transmitting units SD_U1 to SD_U3 substantially simultaneously supply the data signals D_1 to D_3 to the wirings PL_1 to PL_3. The receiving units RV_U1 to RV_U3 receive data signals that have propagated and arrived through the wirings PL_1 to PL_3 via the bump electrode BMP2, and output signal Sout corresponding to the received data signals. In the drawing, "EQ" indicated in each of the transmitting units SD_U1 to SD_U3 and the receiving units RV_U1 to RV_U3 indicate an equalizer.

As shown in FIG. 6, the wirings PL_1 to PL_3 are formed in parallel in the same direction when the substrate is viewed in a plan view, and the wirings PL_1 to PL_3 have equal lengths.

Here, the transmission rate of the parallel signal transmission will be described on the assumption that the transmission rate is equal to or higher than 5 Gbps at which the effect of the crosstalk becomes large. In other words, the transmission rate of the data-signal in each of the wirings PL_1 to PL_3 is equal to or higher than 5 Gbps value. Further, in FIG. 6, the crosstalk signal generated by the data signals D_1 and D_3 propagating through the wirings PL_1 and PL_3 is schematically illustrated by a broken line CLT. A case where the generated crosstalk signal CLT affects the data signal D_2 propagating through the wiring PL_2 sandwiched between the wiring PL_1 and the wiring PL_3 when viewed in a plan view will be described as an example. When viewed from the viewpoint of crosstalk, the wirings PL_1 and PL_3 correspond to Aggressor (s), and the wiring PL_2 corresponds to Victim.

For example, the transmitting unit SD_U1 supplies the data signal D_1 corresponding to the input signal Sin to the corresponding wiring PL_1. The supplied data signal D_1 propagates through the wiring PL_1 and is transmitted to the receiving unit RV_U1. In order to propagate the data signal D_1, one end of the wire PL_1 (for example, bump electrode BMP1) is connected to the input of the transmitting unit SD_U1, and the other end of the wire PL_1 (for example, bump electrode BMP2) is connected to the output of the receiving unit RV_U1. That is, the element of the transmitting unit SD_U1 is connected to one end portion (bump electrode BMP1) of the wiring PL_1, and the element of the receiving unit RV_U1 is connected to the other end portion (bump electrode BMP2) of the wiring PL_1. When the element is connected to both ends of the wiring PL_1, the parasitic capacitance is connected to one end portion and the other end portion of the wiring PL_1.

The data signal D_1 propagated through the wiring PL_1 is reflected by the parasitic capacitance connected to the other end of the wiring PL_1, and a part of the data signal D_1 propagates through the wiring PL_1 as a reflected signal and returns to the direction of the transmitting unit SD_U1. A part of the reflection signal returned to the transmitting unit SD_U1 is reflected by a parasitic capacitance connected to one end of the wiring PL_1, and a part of the reflected signal propagates through the wiring PL_1 again as a reflected signal and propagates to the receiving unit RV_U1. Reflection is repeated at both ends of the wiring PL_1, and so-called multiple reflection occurs. Since multiple reflection occurs, the crosstalk signal CLT due to the reflected signal also occurs in multiple. In FIG. 6, the reciprocating of the reflected signal generated by the multiple reflection is shown as RD_1. Although the wiring PL_1 has been described as an example, the crosstalk signal CLT due to the reflected signal is generated in the wiring PL_3 in a multiplex manner.

As shown in FIG. 6, the bump-electrodes BMP1 and BMP2 overlap the semiconductor chips CHP1, CHP2 when viewed in a plan view. Therefore, when viewed in a plan view, the substantial wiring length SRR between the semiconductor chip CHP1 and the semiconductor chip CHP2 is shorter than the wiring length MRR between the bump electrode BMP1 and the bump electrode BMP2 that generates a multiple reflection.

Since the timing at which the crosstalk signal CTL is multiplexed, that is, the multiplexing timing greatly affects the signal quality of the data signal (data signal D_2 in FIG. 6) affected by the crosstalk signal CTL, the multiplexing timing of the crosstalk signal CLT is important in order to reduce the degradation of the signal quality.

Figure 7A:
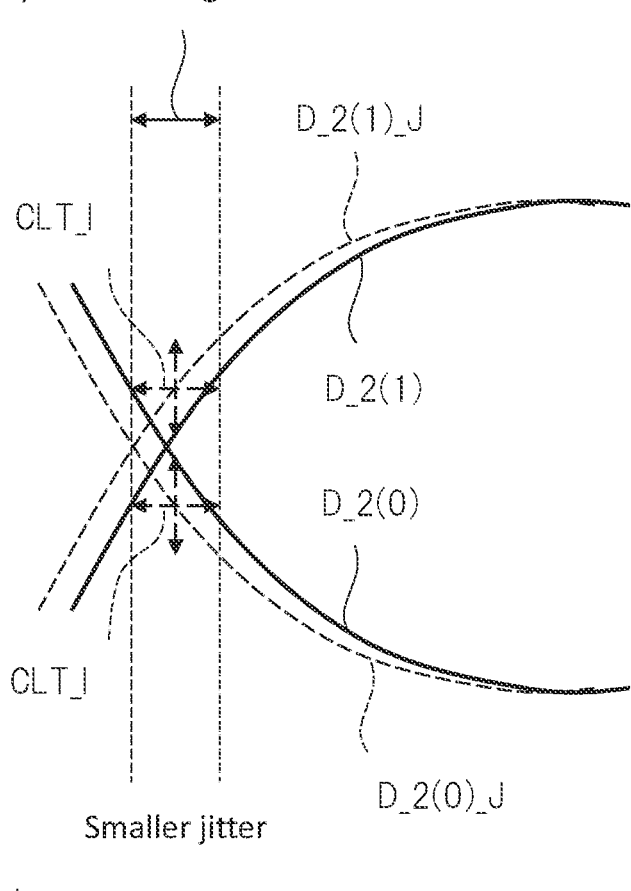
FIGS. 7A and 7B are a diagram for explaining a phenomenon found by the present inventor.
Figure 7B:
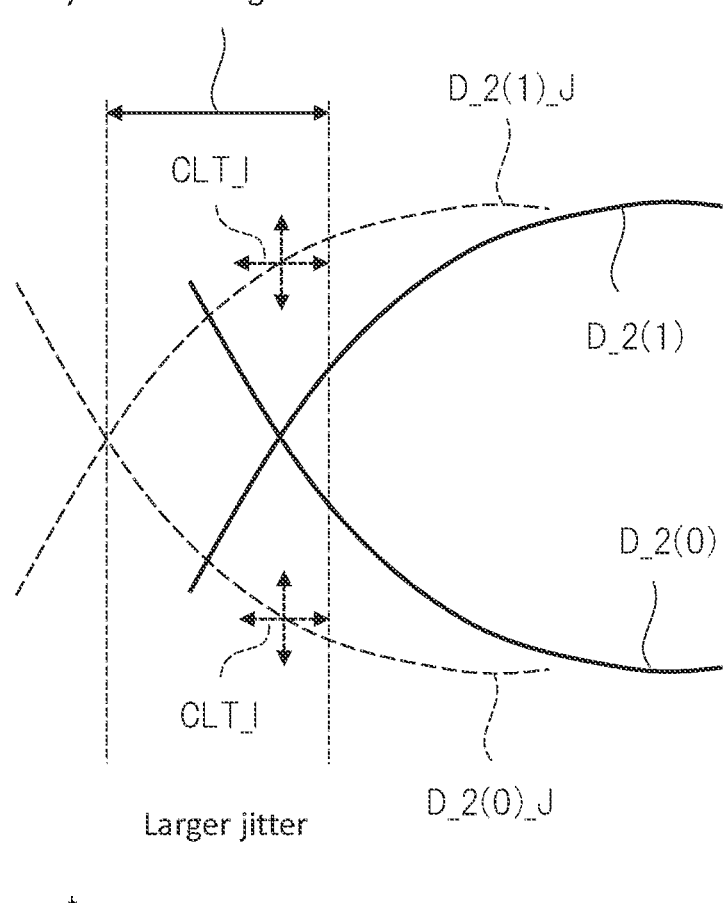

FIG. 7A and FIG. 7B are a diagram for explaining a multiple timing relation between a data signal and a crosstalk signal. The dashed lines D_2(0)_J and D_2(1)_J represent data signal waveforms subjected to crosstalk, and the solid lines D_2(0) and D_2(1) represent crosstalk signal waveforms expanded in the voltage direction.

In the drawing, each of the waveforms D_2(0)_J and D_2(1)_J corresponds to a waveform when the data signal D_2 transitions from the logical value "1" to the logical value "0" and a waveform when the data signal D_2 transitions from the logical value "0" to the logical value "1". The waveforms D_2(0) and D_2(1) correspond to the case where the crosstalk signal changes in the decreasing direction of the voltage and the case where the crosstalk signal changes in the increasing direction of the voltage, respectively.

Unless a specific condition to be described later is not satisfied, the crosstalk signal from the wirings PL_1 and PL_3 to the data signal D_2 is shifted in relative timing from the data signal D_2 little by little each time multiple reflections are repeated. It may be close to the I/O transition point as shown in 7A diagram, or may be far from the I/O transition point as shown in 7B diagram. The time-lapse observation indicates that each time the multiple reflections are repeated, the state between the diagram 7A and the diagram 7B continues to be gradually shifted. Each time a crosstalk signal is received, the timing of the data signal D_2 fluctuates as schematically illustrated in CLT_I, and therefore, it can be understood that the timing variation of the range (Dynamic timing deviation) illustrated in the diagram 7B occurs when all the timing fluctuations are superimposed.

In addition, since the timing variation of the data signal when the crosstalk signal is received is given by the "voltage change rate of the waveform of the crosstalk signal voltage/ data signal D_2", the timing variation is relatively small in the case of the illustrated 7A, and the timing variation is large in the case of the illustrated 7B.

From the above considerations, it can be seen that, in order to minimize the timing variation of the data signal D_2, it is only necessary to maintain the state in 7A of the diagram at all times even if the crosstalk signal is input. A particular criterion for this is that the round-trip delay of the signal is exactly divisible by the data signal duration UI (Unit interval), i.e. the following Formula (1) holds.

$$\text{(Signal Delay of Wiring for Transmitting Data Signal} \times 2) \bmod \text{UI} = 0 \qquad \text{Formula (1)}$$

In FIG. 6, FIG. 7A, and FIG. 7B, the data signal is transmitted from the semiconductor chip CHP1 to the semiconductor chip CHP2, but the same applies when the data signal is transmitted from the semiconductor chip CHP2 to the semiconductor chip CHP1.

Figure 8:
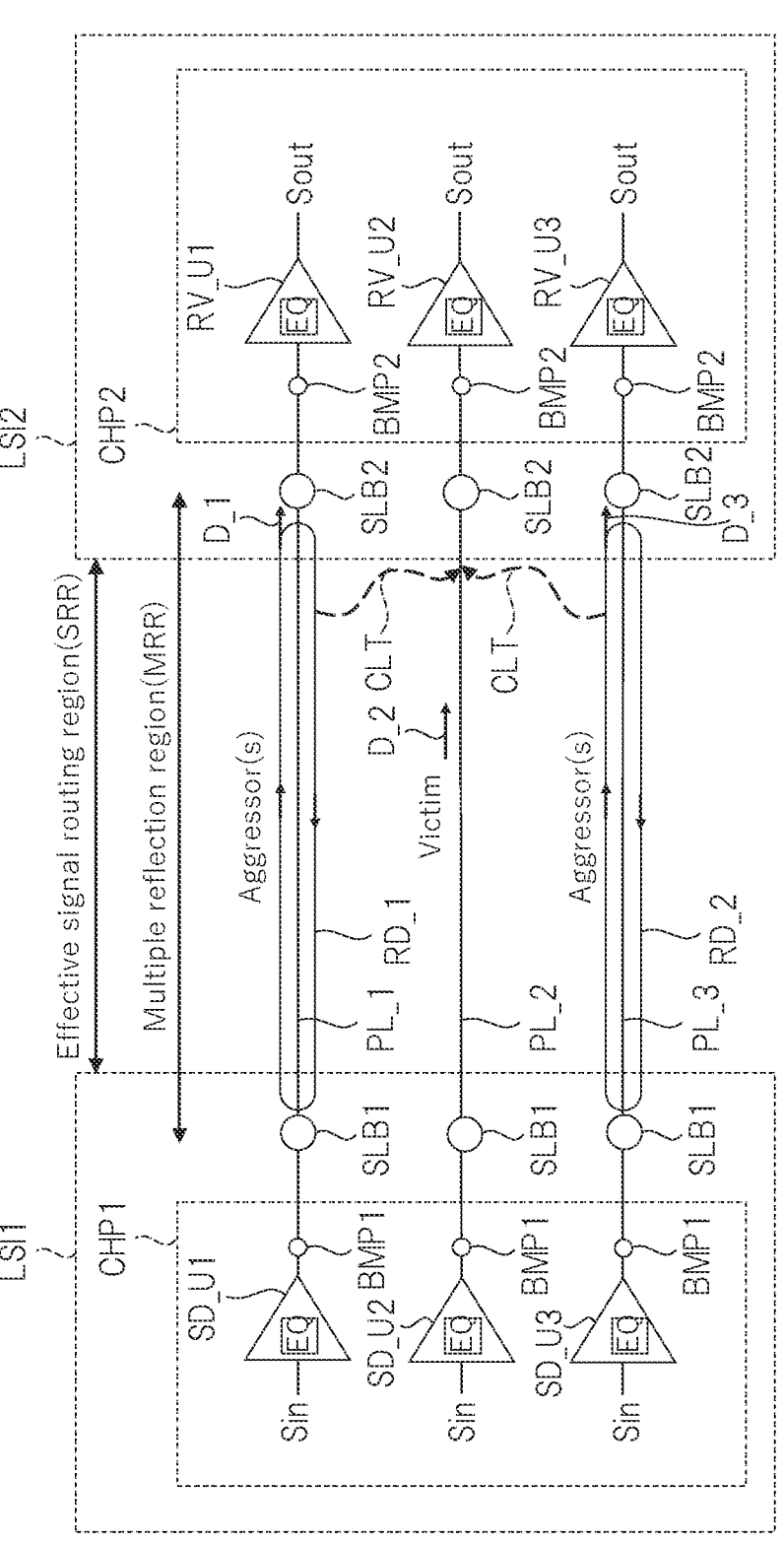
FIG. 8 is a diagram for explaining a phenomenon found by the present inventor.

FIG. 8 shows a configuration of an electronic semiconductor device LSI1 and a LSI2 mounted on the same substrate and configured to perform parallel device transmission between the LSI1 and LSI2. Also in this case, the wirings connecting semiconductor device LSI1 and LSI2 are arranged on the same substrate as semiconductor device LSI1 and LSI2. Since FIG. 8 is similar to FIG. 6, the differences will be mainly described.

The semiconductor devices LSI1 and LSI2 include a semiconductor chip. In FIG. 8, "CHP1", "CHP2" and "PL_1 to PL_3" are the same as semiconductor chips CHP1, CHP2 and wirings PL_1 to PL_3 shown in FIG. 6. The difference is that the bump electrode BMP1, BMP2 formed on the semiconductor chip CHP1, CHP2 is connected to the semiconductor device LSI1, the electrode (e.g., solder ball electrode) SLB1, SLB2 of the semiconductor device formed on the LSI, and the electrode SLB1, SLB2 is connected to the end portion of the wirings PL_1 to PL_3.

In case of coupling between the semiconductor device LSI1 and the semiconductor device LSI2 via a wiring and performing a parallel signal transmission therebetween, as described in FIGS. 6, 7A and 7B, the crosstalk signal CLT is generated and the multiple reflected signals are generated, thereby the multiple crosstalk signal CLT is generated.

Therefore, by setting the wiring length MRR between the terminals (electrode SLB1 and electrode SLB2) of each wiring PL_1 to PL_3 so that the signal delay in each wiring PL_1 to PL_3 is divisible by 0.5 UI, it is possible to reduce the deterioration of the signal quality due to the crosstalk signal CLT of the multiple crosstalk signal CLT.

Although FIG. 8 also illustrates a case where a data signal is transmitted from the semiconductor device LSI1 to the semiconductor device LSI2, the same applies to a case where a data signal is transmitted from the semiconductor device LSI2 to the semiconductor device LSI1.

The equalizer EQ shown in FIGS. 6 and 8 is comprised of a filter circuit such as DFE (Decision Feedback Equalizer) and FFE (Feed Forward Equalizer). In the parallel signal transmission, the signal quality is influenced not only by the crosstalk signal described above but also by the signal reflection transmitted in the receiving unit. The equalizer EQ not only reduces the effect of the signal reflection, but also theoretically reduces the effect of the crosstalk signal, but in order to configure the equalizer so as to reduce the effect of the crosstalk signal, the circuit scale of the equalizer becomes very large and is not realistic. In FIGS. 6 and 8, as described above, since the effect of the crosstalk is reduced by setting the wire length so that the signal delay is divisible by 0.5 UI, the equalizer EQ only needs to be provided to reduce the effect of the signal reflection. Therefore, the equalizer EQ can be a small circuit capable of reducing the influence of signal reflection. As a consequence, the size of the semiconductor chip or semiconductor device can be reduced.

Although FIG. 6 and FIG. 8 show an example in which the equalizer EQ is provided in both the transmitting unit and the receiving unit, the equalizer EQ may be provided only in one of the units.

«Verification»

The present inventors performed verification using a computer based on the above-described grounds. FIG. 9 to FIG. 13 are diagrams for explaining verification by the present inventor and the results thereof.

Figure 9:
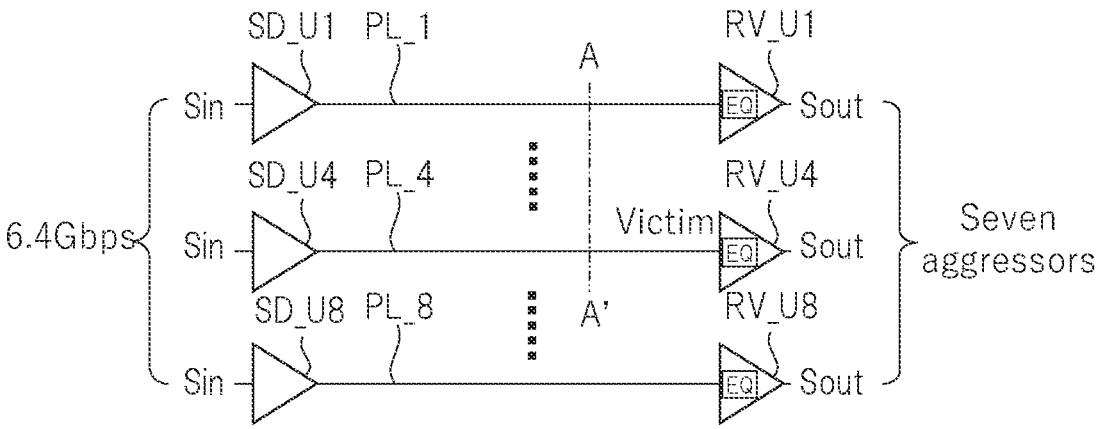
FIG. 9 is a diagram for explaining a verification by the present inventor and the result of the verification.
Figure 10:
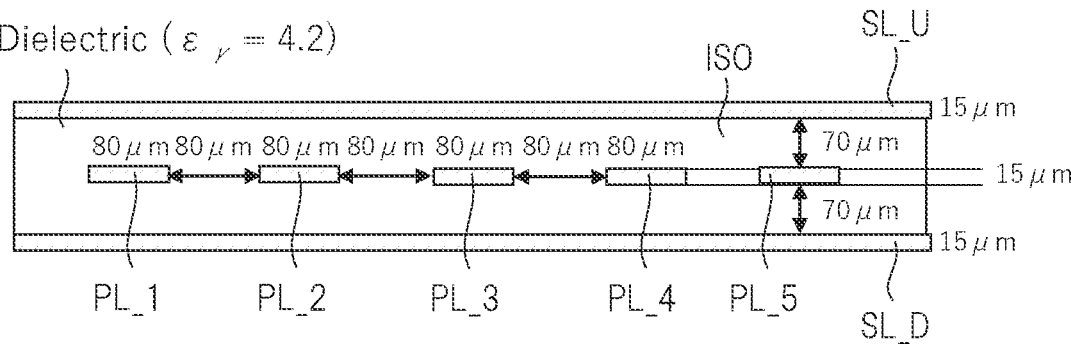
FIG. 10 is a diagram for explaining the verification by the present inventor and the result of the verification.

FIG. 9 and FIG. 10 are a diagram showing a structure used for a verification. In the verification, a structure in which eight signals constituting one byte are used as a data signal and eight wirings are transmitted in parallel is used as an object of verification. That is, as shown in FIG. 9, eight wirings PL_1 to PL_8 are arranged on the substrate so as to be parallel to each other. As shown in FIG. 9, the outputs of the transmitting units SD_U1 to SD_U8 are connected to one end of the wiring PL_1 to PL_8, and the inputs of the receiving units RV_U1 to RV_U8 are connected to the other end of the wirings PL_1 to PL_8 so that the parasitic capacitances are connected to both ends of the eight wirings PL_1 to PL_8. Each of the receiving units RV_U1 to RV_U8 is provided with an equalizer EQ configured by a one-tap DFE. Here, the influence of the crosstalk signal generated by the data signal propagating through the seven wirings except the wirings PL_4 among the wirings PL_1 to PL_8 on the data signal propagating through the wire PL_4 was obtained by waveform analysis.

FIG. 10 is a schematic cross-sectional view showing a cross section at the broken line portion A-A' shown in FIG. 9. As shown in FIG. 10, the signal line width and the wiring interval of each wiring are 80 μm. The thickness of each wiring is 15 μm. The wirings PL_1 to PL_8 are sandwiched between upper and lower wiring layers SL_U and SL_D, and a dielectric ISO having a relative dielectric constant of 4.2 is filled between wiring layers SL_U and SL_D and wirings PL_1 to PL_8. The ground voltage GND is supplied to the wiring layers SL_U and SL_D. That is, the wirings PL_1 to PL_8 are a so-called strip line.

The transmitting units SD_U1 to SD_U8 operate as transmitting units composing a DRAM called Dual-rank or 2-rank. That is, the transmitting units SD_U1 to SD_U8 are operated as simultaneous switching output (SSO) read operations of DRAM to perform analysis. The data-signal transmission rate at this time is 6.4 Gbps.

Figure 11:
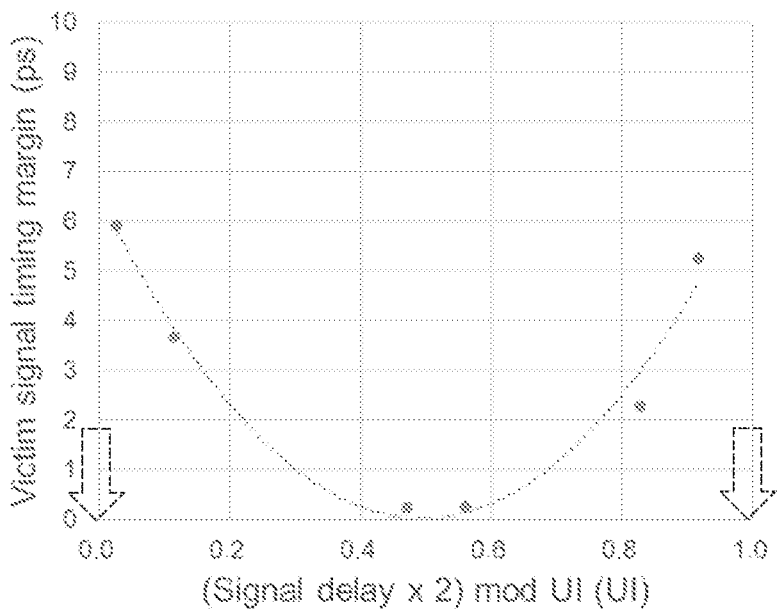
FIG. 11 is a diagram for explaining the verification by the present inventor and the result of the verification.

FIG. 11 is a graph created based on a result obtained by waveform analysis of the structure shown in FIGS. 9 and 10. The horizontal axis represents the value of Formula (2).

$$\text{(Signal Delay of Wiring for Transmitting Data Signal} \times 2) \bmod \text{UI} \qquad \text{Formula (2)}$$

The vertical axis represents the timing margin observed at the receiving unit RV_U4 in the wire PL_4 (Victim). The larger the value of the timing margin on the vertical axis is, the more margin is present in the timing.

As can be understood from FIG. 11, the closer the value on the horizontal axis is to the numerical value "0", the larger the timing margin on the vertical axis and the more margin can be made in timing. If there is a margin in the timing, the influence of the crosstalk signal may be large. That is, the wiring interval can be reduced.

Figure 12:
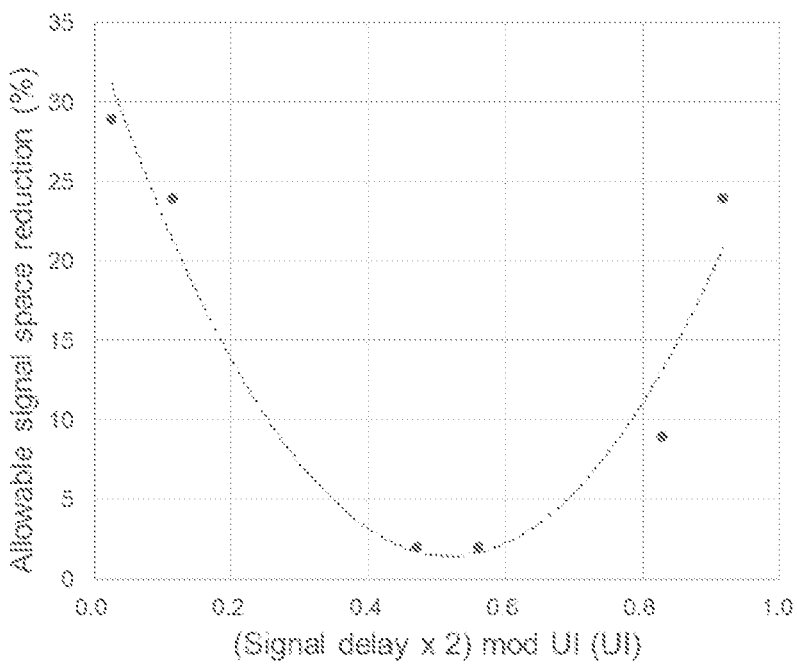
FIG. 12 is a diagram for explaining the verification by the present inventor and the result of the verification.

FIG. 12 is a graph showing a result of determining whether the timing margin becomes zero (numerical value 0) when the wiring interval is reduced. In FIG. 12, the numerical value is represented by a relative value, the horizontal axis is the same as in FIG. 10, and the vertical axis indicates the possible reduction ratio of the wiring interval. It is possible to reduce the wiring interval as the large possible reduction ratio. When the result of Formula (2) is a condition that the value is "0", FIG. 12 shows that it is possible to reduce the wiring interval by about 30%.

In the structures shown in FIGS. 9 and 10, the wirings PL_1 to PL_8 are completely equal in length and completely equal in interval between wirings. However, in actual artwork, it is difficult to make the wirings PL_1 to PL_8 have full equal lengths and completely equally spaced.

Figure 13:
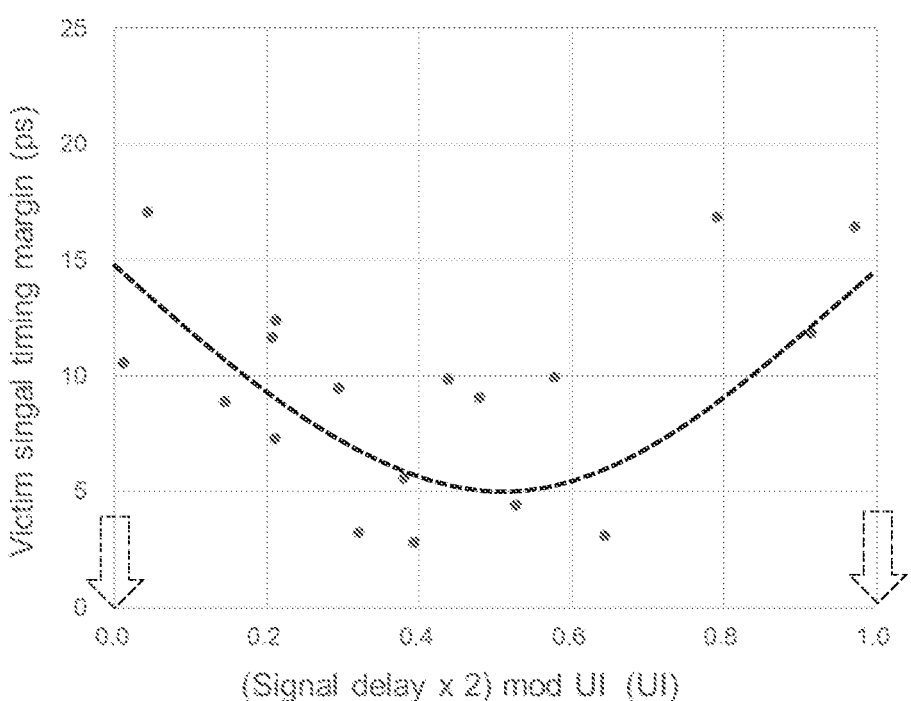
FIG. 13 is a diagram for explaining the verification by the present inventor and the result of the verification.

Therefore, the inventor of the present invention has analyzed the timing margin of the wiring on the product by using a product in which wiring lines of various lengths are formed for performing the parallel signal transmission. FIG. 13 is a graph obtained by analyzing the timing margin. The horizontal axis and the vertical axis in FIG. 13 are the same as those in FIG. 12. In FIG. 13, as in FIG. 12, when the result of the Formula (2) is the numerical value "0", the wiring interval reduction ratio on the vertical axis becomes the largest value.

The inventors have also analyzed two groups of data signals in order to collect more data. Here, the two data signal groups mean two groups in which the structures shown in FIGS. 9 and 10 are one group. Each group includes one clock signal and nine data signals which are in synchronization with the clock signal. The two data signal groups have different signal delays in the wiring. Even in such two data signal groups, the tendency is similar to that in FIG. 12, and when the result of Formula (2) is the numerical value "0", the wiring interval possible reduction ratio of the vertical axis becomes the largest.

First Embodiment

Figure 1B:
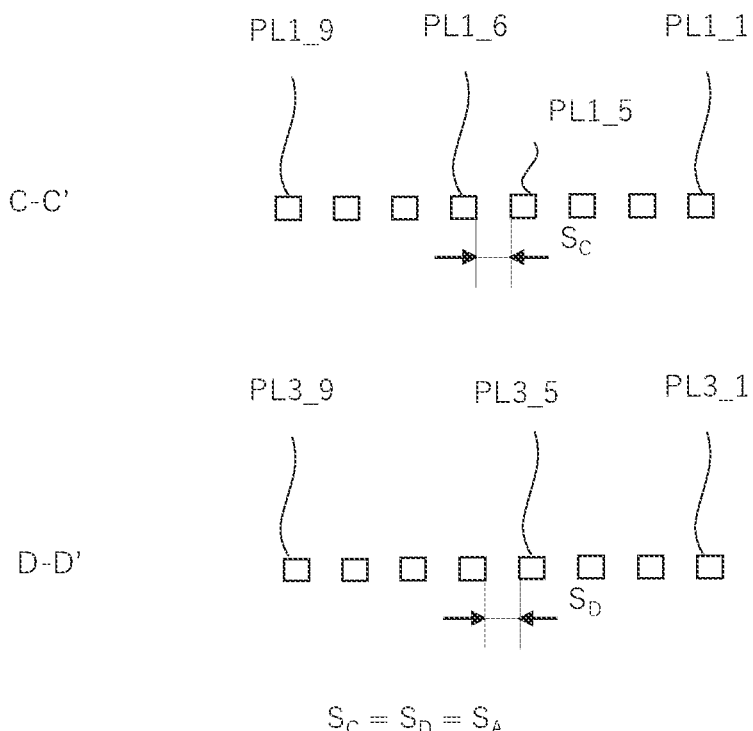

In a first embodiment, a plurality of semiconductor devices each in which a semiconductor chip is sealed with a resin is mounted side by side on a substrate (motherboard), and the plurality of semiconductor devices is coupled to each other via a wiring formed in a substrate. FIG. 1A is a plan view showing a configuration of an electronic device according to the first embodiment. Further, FIG. 1B is a cross-sectional view showing a cross section of the electronic device shown in FIG. 1A.

In FIG. 1A, "1" denotes an electronic device. The electronic device 1 includes a printed substrate (motherboard) 2 functioning as a substrate, a plurality of electronic components such as a semiconductor device mounted on the printed substrate 2, and a plurality of wiring groups coupling the semiconductor devices. In order to avoid complicating the drawing, of these electronic components and the wiring groups, only two semiconductor devices 3, 4 and the wiring groups PL1-PL4 connecting the two semiconductor devices 3, 4 are shown in FIG. 1A. Further, in FIG. 1A, a plan view when the printed substrate 2 is viewed from the surface of the electronic component (semiconductor devices 3, 4) is depicted. That is, in FIG. 1A, the semiconductor devices 3 and 4 and the print substrate 2 are arranged in this order toward the back of the paper surface.

Here, semiconductor device (hereinafter, also referred to as the first semiconductor device) 3 is a semiconductor device formed by sealing a microcomputer chip with a package, and semiconductor device (hereinafter, also referred to as the second semiconductor device) 4 is described by exemplifying a semiconductor device formed by sealing a memory chip with a package. Needless to say, the semiconductor devices 3 and 4 are not limited to this.

As shown in the drawing, each of the wiring groups PL1~PL4 connecting the semiconductor devices 3 and 4 is constituted by nine wirings that are parallel to each other when viewed in a plan view.

Taking the wiring group (first wiring group) PL1 as an example, the wiring group PL1 includes nine wirings (first wirings) PL1_1 to PL1_9. The wirings PL1_1 to PL1_9 are formed in the printed substrate 2, and are arranged in parallel such that, when viewed in a plan view, the wiring intervals between the wirings adjoining each other are equal to each other, that is, equal to each other. The nine wirings PL1_1 to PL1_9 are equal-length wirings. One end of each of the wirings PL1_1 to PL1_9 is connected to an input/output unit in the microcomputer chip via an electrode provided in the microcomputer chip. Similarly, the other end of each of the wirings PL1_1 to PL1_9 is connected to an input/output unit in the memory chip via an electrode provided in the memory chip. Although not particularly limited, the input/output unit of the microcomputer chip and the memory chip includes an equalizer, and the equalizer is connected to a corresponding wiring.

Although the wiring group PL1 is exemplified, the same applies to the wiring groups PL2~ PL4. In the illustrated 1A, only two of the nine wirings of the wiring groups PL2, PL3 and PL4 are denoted by reference numerals. For example, the wiring group (second wiring group) PL3 includes nine wirings (second wirings), but in FIG. 1A, only two wirings are denoted by reference numerals PL3_1 and PL3_5.

In FIG. 1A, the two wiring groups PL3, PL4 are arranged between one side 3_P1 of the semiconductor device 3 and one side 4_P3 of semiconductor device 4 opposed to the one side 3_P1 when viewed in a plan view. Further, when viewed in a plan view, the wiring group PL1 and the wiring group PL2 are arranged so as to detour the outer side of the wiring group PL3, PL4 so as to sandwich the wiring group PL3 and PL4 therebetween.

Between the semiconductor devices 3 and 4, 8-bit data signals differing from each other are transmitted in parallel by the wiring groups PL1~PL4. For example, referring to the wiring group PL1, the semiconductor device 3 supplies a clock signal to the semiconductor device 4 using the wiring PL1_4, and supplies an 8-bit data signal to semiconductor device 4 in parallel using eight wiring lines (PL1_1 to PL1_4 and PL1_6 to PL1_9). At this time, the 8-bit data signal is synchronized with the clock signal. The same applies to other wiring groups PL2~PL4. Hereinafter, a wiring for transmitting a clock signal is also referred to as a clock signal wiring, and a wiring for transmitting a data signal synchronized with the clock signal is also referred to as a data signal wiring.

Hereinafter, a case will be described in which the clock signal wiring is a wiring (PL1_5, PL2_5, PL3_5, and PL4_5) arranged in the central in the wiring group, but a wiring arranged outside the center may be used as the clock signal wiring.

The wiring length of each wiring in the wiring groups PL1 -PL4 is set in the first embodiment based on the data signal times UI of the clock signals. When the wiring group PL1 is exemplified, the wiring length of the clock signal wiring PL1_5 is set so that the signal delay of the clock signal wiring PL1_5 is divisible by the half (0.5 UI) of the data signal time UI of the clock signal. In the wiring group PL1, the wiring excluding the clock signal wiring PL1_5, that is, the data signal wirings PL1_1 to PL1_4 and PL1_6 to PL1_9 are set to have the same length as the clock signal wiring PL1_5.

In other wiring groups PL2~PL4, similarly to the wiring group PL1, in the corresponding wiring group, the wiring length of the clock signal wiring is set so that the signal delay of the clock signal wiring is divisible by the half (0.5 UI) of the data signal time UI of the clock signal of the corresponding wiring group, and the data signal wiring is set to be equal in length to the clock signal wiring. The clock signal delays between the wiring groups may be the same as or different from each other.

Here, it is assumed that the memory chip composing the semiconductor device 4 operates in accordance with the signaling standard LPDDR5 or LPDDR5X. That is, the transmission of a signal between the semiconductor device 3 and the semiconductor device 4 is performed according to the signal standard LPDDR5 or LPDDR5X. In order to comply with the signal standard LPDDR5 or LPDDR5X, data signals can be transmitted between the semiconductor device 3 and the semiconductor device 4 at 6.4 Gbps or 8.533 Gbps signal transmission rates. The dielectric constant of the dielectric of the printed substrate 2 is 4.4.

Therefore, in the wiring groups PL1-PL4, the wiring length corresponding to one data-signal-time UI is 11.16 mm or 8.67 mm. In the signal standards LPDDR5 and LPDDR5X, since the transmission rate of the data signal of the command system is ¼ times the transmission rate of the data signal of the data system, the limitation of the crosstalk with respect to the data signal of the command system is not as severe as that of the data signal of the data system, and therefore, the present disclosure is applied only to the data signal of the data system in the following explanation.

In the illustrated 1A, as described above, the wiring length of the clock signal wiring line PL1_5 that propagates the clock signal is set to a value in which the signal delay in the wiring line PL1_5 is divisible by 0.5 UI. In other words, the wiring length of the wiring PL1_5 is set to an integer multiple of half (½) of the wiring length of 11.16 mm or 8.67 mm. In the other wiring group PL2-PL4, similarly to the wiring group PL1, the wiring lengths of the clock-signal wirings PL2_5, PL3_5, and PL4_5 are set to an integral multiple of half (½) of the wiring length of 11.16 mm or 8.67 mm. Although not particularly limited, in FIG. 1A, the clock signal wirings PL1_5 and PL2_5 are set to a wiring length corresponding to 2.0 UI (four times 0.5 UI), and the clock signal wirings PL2_5 and PL3_5 are set to a wiring length corresponding to 1.5 UI (three times 0.5 UI).

In the signal standards LPDDR5 and LPDDR5X, the delay time difference between the clock signal and the data signal of the data system synchronized with the clock signal is required to be as close as possible to either 0 (zero) or 0.5 UI in the wire arranged in substrate. Therefore, the average value of the data signal time UI of the data signal of the data system is equal to or close to the data signal time UI of the clock signal. As a consequence, the wiring length of the data signal wiring (for example, PL1_1 to PL1_4 and PL1_6 to PL1_9) that transmits the data signal of the data system is a value such that the signal delay of the data signal wiring is divisible by 0.5 UI or a value close thereto. In other words, the wiring length of the data signal wiring is a value close to an integer multiple or an integer multiple of the wiring length corresponding to 0.5 times the data signal time UI of the data signal of the data system.

Consequently, the wiring lengths of all the wirings PL1_1 to PL_9 in the wiring groups PL1 are set to a value such that the signal delay in these wirings is divisible by 0.5 UI or a value close thereto.

Similarly, in the other wiring groups PL2-PL4, the wiring lengths of the clock signal wirings PL2_5, PL3_5, and PL4_5 are set such that the signal delays in the clock signal wirings are divisible by 0.5 UI. Consequently, in each of the wiring groups PL2-PL4, the wiring length of the data signal wiring is set to a value such that the signal delay in the data signal wiring is divisible by 0.5 UI or a value close thereto.

As described in the column of «PEHENOMENON AND RETIONALE», the effect of the crosstalk signal can be reduced by dividing the signal delay of the wire by 0.5 UI. As a consequence, the wiring interval between the plurality of wirings (for example, wirings PL1_1 to PL1_9) of the wiring groups PL1~PL4 can be made equal to each other and small.

In FIG. 1B, a schematic cross section is shown in the broken line portion C-C' and D-D' shown in FIG. 1A. In FIG. 1B, C-C' represents a cross section of the broken line portion C-C' shown in FIG. 1A, and D-D' represents a cross section of the broken line portion D-D'. Note that, in FIG. 1B, the printed substrate 2 is omitted, and the wiring (for example, PL1_1, PL1_5, and PL1_9) of the wiring group PL1 and the wiring (for example, PL3_1 and PL3_5) of the wiring group PL3 are shown. In the illustrated 1B, the wiring interval in the wiring group PL1 is indicated as a reference numeral $S_C$, and the wiring spacing in the wiring group PL3 is indicated as a reference numeral $S_D$.

In the first embodiment, the wiring interval is set to the same wiring interval $S_A$ between the wiring groups PL1~PL4 as shown in FIG. 1B. In addition, the wiring interval ($S_C$, $S_D$) in the wiring groups PL1-PL4 can be optimized and minimized. By minimizing the wiring interval, the area of the wiring region can be reduced, the product of the area of the wiring region and the number of wiring layers can be reduced, and an increase in cost when the transmission speed is improved can be suppressed.

Modified Example

Figure 2A:
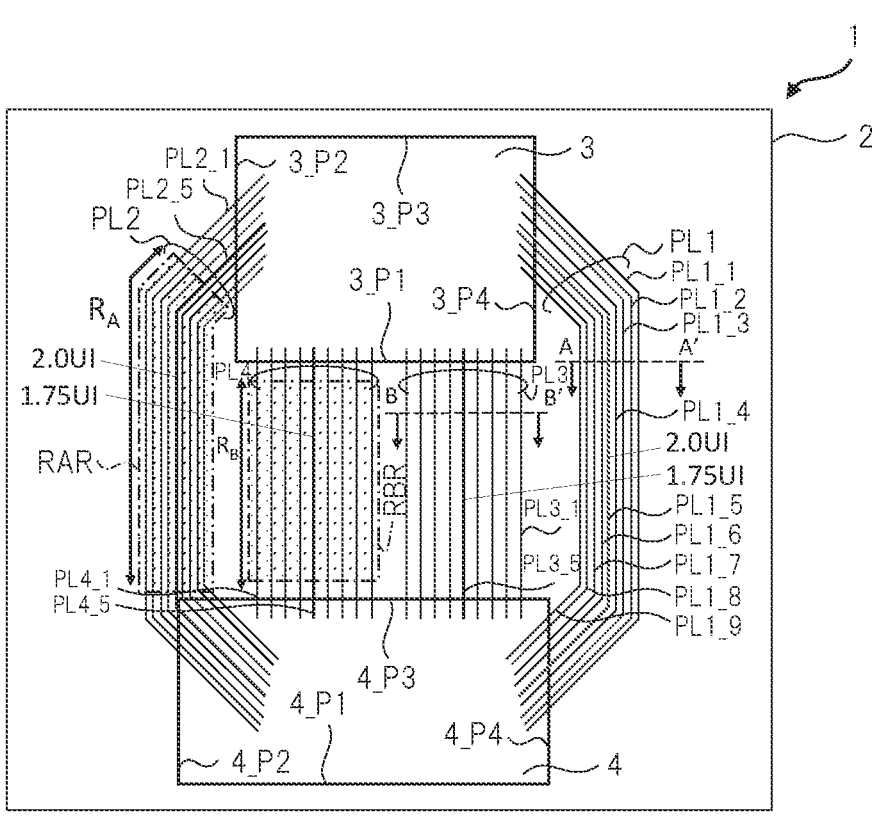
FIGS. 2A and 2B are a plan view and a cross-sectional view, respectively, each showing a configuration of an electronic device according to a modified example of the first embodiment.
Figure 2B:
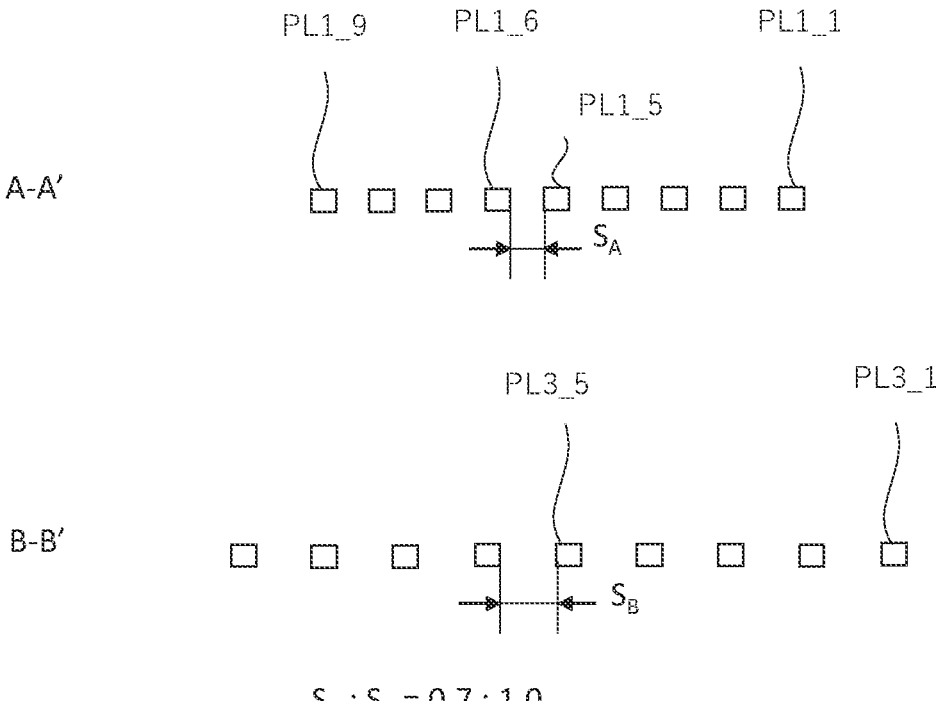

FIG. 2A and FIG. 2B are a diagram showing a configuration of an electronic device according to a modified example of the first embodiment. Here, FIG. 2A is a plan view showing a configuration of the electronic device according to the modified example, and FIG. 2B is a cross-sectional view showing a cross section of the electronic device shown in FIG. 2A at a broken line portion A-A' and at a broken line portion B-B'. FIGS. 2A and 2B are similar to FIGS. 1A and 1B and thus mainly explain the differences.

In FIG. 1A, as described above, in each of the wiring groups PL1-PL4, the wiring length is set such that the signal delay in the clock signal wirings PL1_5, PL2_5, PL3_5 and PL4_5 is divisible by 0.5 UI, and such that the signal delay in the clock signal wirings and the data signal wirings of the data system (for example, wirings PL1_1, PL2_1, PL3_1, and PL4_1) are divisible by 0.5 UI. However, some wiring groups may have a wiring length such that the signal delay in the clock signal wiring is not divisible by 0.5 UI. The modified example provides a countermeasure in such cases.

In the modified example, a wiring interval is set for each wiring group. That is, when the signal delay is not divisible by 0.5 UI, it is difficult to reduce the effect of the crosstalk signal. Therefore, in the wiring group including the clock signal wiring in which the signal delay is not divisible by 0.5 UI, the wiring interval is made wider than the wiring interval in the wiring group including the clock signal wiring in which the signal delay is divisible by 0.5 UI.

In the diagram 2A, the signal delays of the clock signal lines PL3_5 and PL4_5 in the wiring groups PL3 and PL4 are not divisible by 0.5 UI but are 1.75 UI, and a fraction 0.25 is generated. Here, the wiring lengths of the clock-signal wiring lines PL3_5 and PL4_5 are the lengths corresponding to 1.75 UI. In addition, since the data signal lines (for example, PL3_1 and PL4_1) of the data system in the wiring groups PL3 and PL4 are equal in length to the clock signal lines PL3_5 and PL4_5, the wiring length thereof is the length corresponding to 1.75 UI.

On the other hand, the signal delays of the clock signal lines PL1_5 and PL2_5 in the wiring groups PL1 and PL2 have a 2.0UI divisible by 0.5 UI. Here, the wiring lengths of the clock-signal wiring lines PL1_5 and PL2_5 are the lengths corresponding to 2.0UI. Similarly, since the data-signal wiring lines (for example, PL1_1 and PL2_1) of the data system in the wiring groups PL1 and PL2 are equal in length to the wiring lines PL1_5 and PL2_5, the wiring length thereof is a length corresponding to 2.0UI.

In the wiring groups PL3, PL4, the effect of the crosstalk signal is reduced by making the wiring interval in the wiring groups PL3, PL4 wider than the wiring interval in the wiring groups PL1, PL2. At this time, in the wiring groups PL1, PL2, the area of the wiring area can be reduced and the effect of the crosstalk signal can be reduced.

Further, as shown in FIG. 2A, in the wiring group PL1 and PL2 arranged so as to detour the wiring group PL3 and PL4, it is desirable to set the wiring length of the clock signal wiring to a value such that the signal delay is divisible by 0.5 UI in order to suppress an increased area of the wiring area. That is, the wiring group PL1, PL2 is longer than the wiring group PL3, PL4 in order to detour the wiring group PL3, PL4. In the wiring groups PL1, PL4 that is long, increasing the area of the wiring area can be suppressed more efficiently by reducing the wiring interval.

In modified example, as shown in FIG. 2B, the wiring interval (first wiring interval) $S_A$ in the wiring groups PL1 and PL2 and the wiring interval (second wiring interval) $S_B$ in the wiring groups PL3 and PL4 are 0.7 to 1.0. The value of the wiring interval $S_A$ is the same as the value of the wiring interval $S_A$ shown in FIG. 1B.

In FIG. 2A, a region RAR with a dashed-dotted line indicates a region in which the wiring interval is set to the wiring interval $S_A$ in the wiring group PL2, and a region RBR with a dashed-dotted line indicates a region in which the wiring interval is set to the wiring interval S3 in the wiring group PL4. In FIG. 2A, RA indicates the wiring length of the wiring arranged in the region RAR, and RB indicates the wiring length of the wiring arranged in the region RBR. Although not shown in FIG. 2A, in the wiring group PL1, there is also a region RAR having a dashed-dotted line, in this region RAR, the wiring interval is set to the wiring interval $S_A$, and in the wiring group PL3, there is also a region RBR having a dashed-dotted line, and in this region RBR, the wiring interval is set to the wiring interval $S_B$.

As described above, since the ratio of the wiring spacing is 0.7 to 1.0, as shown in the diagram 1A, when the signal delay is divisible by 0.5 UI in all the wiring groups, the wiring spacing as a whole can be reduced by 30% compared with the case where the wiring spacing is widened in order to reduce the effect of the crosstalk signal (1.0– 0.7=0.3=30%). On the other hand, as shown in 2A, when half of the wiring groups PL1 and PL2 of the four wiring group PL1-PL4 are divided by 0.5 UI, the wiring interval can be reduced by 15% as a whole (30%/2=15%).

The reduction rate of the wiring interval depends on the timing margin, the input/output impedance, and the like of the input/output units included in the semiconductor chips in semiconductor devices 3 and 4. Therefore, the above-described reduction rate of 30% and 15% is an example.
<Realistic Artwork>

In realistic artwork, for example, in a plurality of wirings constituting one wiring group, it is rare that wirings can be arranged while keeping the wiring interval constant. Similarly, it is rare that the ratio of the wiring intervals between the plurality of wiring groups can be kept constant. In particular, since the pins that are the terminals of semiconductor devices 3 and 4 are crowded in the region of the printed substrate 2 covered by the semiconductor device 3 and 4, that is, in the area immediately below the semiconductor devices 3 and 4, that is, in the so-called fan-out (fan-out) area, the wiring interval is often exceptionally narrow in the fan-out area. That is, when a plurality of wirings constituting the wiring groups are arranged across an area not covered with semiconductor device (an area outside the fan-out area) and the fan-out area, the wiring interval changes between the fan-out area and the outside of the fan-out area.

For a plurality of wiring groups arranged across the fan-out region and the outside of the fan-out region, when the ratio of the wiring spacing between the wiring groups is set to 0.7 to 1.0 as described in the column of <MODIFIED EXAMPLE>, the effect of reducing the area of the wiring region varies depending on the wiring length for which the ratio is set.

The present inventors believe that by setting the above-described ratio of the wiring to half (½) or more of the wiring lengths of the wiring groups arranged in the printed substrate 2, the area can be reduced. For example, in FIG. 2A, the wiring lengths $R_A$ and $R_B$ in which the ratio of the wiring interval is set to 0.7 to 1.0 are respectively set to be equal to or more than half (50%) of the total wiring lengths of the wiring group PL2 and PL4, so that the present inventors believe that the area is reduced. However, in the case of 50% or more, it is conceivable that the effect of area reduction is obtained by chance, and therefore the present inventor has considered that the ratio of the wiring interval is determined based on the statistical idea.

When considered statistically, in the wiring of 1-exp(−1) =63% of the total wiring length of the wiring group arranged in the printed substrate 2, the ratio of the wiring interval is set to, for example, 0.7 to 1.0 as described above, the present inventors considered that a clear area reduction effect without accident can be obtained. Here, as described above, in the wiring group, there is a region overlapping with the fan-out region, and it is difficult to set the ratio of the wiring interval in the region overlapping with the fan-out region. A region (exceptional region) where it is difficult to set the ratio of the wiring interval exists at both ends of the wiring group, and is experimentally at most 20% with respect to the total wiring length. Therefore, the ratio of the wiring length to which the ratio of the wiring interval is to be set to the total wiring length of the wiring group except for the exceptional region is expressed by the following Formula (3).

$$1-\exp(-1)/(100\%-20\%)=79\% \qquad \text{Formula (3)}$$

In addition, in a case where the total wiring length of the wiring group is long or the like, the proportion of the exceptional region may be as small as about 10%, for example. In this case, the ratio of the wiring length to which the ratio of the wiring interval is to be set to the total wiring length of the wiring group except for the exceptional region is expressed by the following Formula (4).

$$1-\exp(-1)/(100\%-10\%)=70\% \hspace{2cm} \text{Formula (4)}$$

From the viewpoint of shortening the total wiring length of the wiring group and reducing the area of the wiring region, it is desirable that the ratio of the wiring length to which the ratio of the wiring interval (for example, 0.7 to 1.0) should be set to the total wiring length of the wiring group is 79' or more.

According to the first embodiment, since the wiring length is set so that the signal delay is divisible by 0.5 UI, the timing of the multi-reflection crosstalk signal can be adjusted to the timing of the I/O transition point of the data signal. As a result, the timing variation of the data signal due to the multireflection crosstalk signal is minimized.

In the first embodiment, the wiring length of the clock signal wiring is set so that the signal delay of the clock signal wiring is divisible by 0.5 UI by using the clock signal used in the parallel signal transmission. In the parallel signal transmission, depending on the timing standard, the data signal is synchronized with the clock signal, and the timing differential between the clock signal and the data signal is 0 or 0.5 UI. If this timing-difference is, for example, 0, the signal delay associated with the data signal is also divisible by 0.5 UI. In addition, even when the timing-difference is 0.5 UI, the signal delay associated with the data-signal is close to a value that is automatically divisible by 0.5 UI.

By dividing the signal delay by 0.5 UI, the timing variation due to the multiple crosstalk signals is minimized, and a margin is generated in the timing. As a result, the product of the number of wiring layers and the wiring region can be reduced, and the cost can be reduced.

When the wiring interval is set for each wiring group, it is possible to reduce the area of the wiring region as long as the wiring length that maintains the ratio of the wiring interval between the wiring groups is at least half of the total wiring length of the wiring group. A desirable value of the wiring length for maintaining the ratio of the wiring intervals between the wiring groups is 63% or more of the total wiring length of the wiring group. In addition, in the case where the exceptional region overlapping with the fanout region is excluded, a desirable value of the wiring length for maintaining the ratio of the wiring interval between the wiring groups is 70 to 79% or more of the total wiring length of the wiring group.

In the parallel signal transmission, when there is no clock signal, or when the timing difference between the clock signal and the data signal does not comply with the standard, that is, when the timing difference is not 0 or 0.5 UI, the wiring length of the wiring group may be determined such that the mean signal delay of the wiring group is an integral multiple of 0.5 UI.

Second Embodiment

In the first embodiment, an electronic device including a plurality of semiconductor devices and wirings mounted on a substrate such as a printed substrate has been exemplified. In a second embodiment, a semiconductor device in which a plurality of semiconductor chips is mounted side by side on a substrate (interposer) and the plurality of semiconductor chips are connected to each other via a wire formed in a substrate, so-called SiP (System in Package), will be described. It is assumed that the semiconductor chip is flip-chip mounted on a substrate.

Figure 3A:
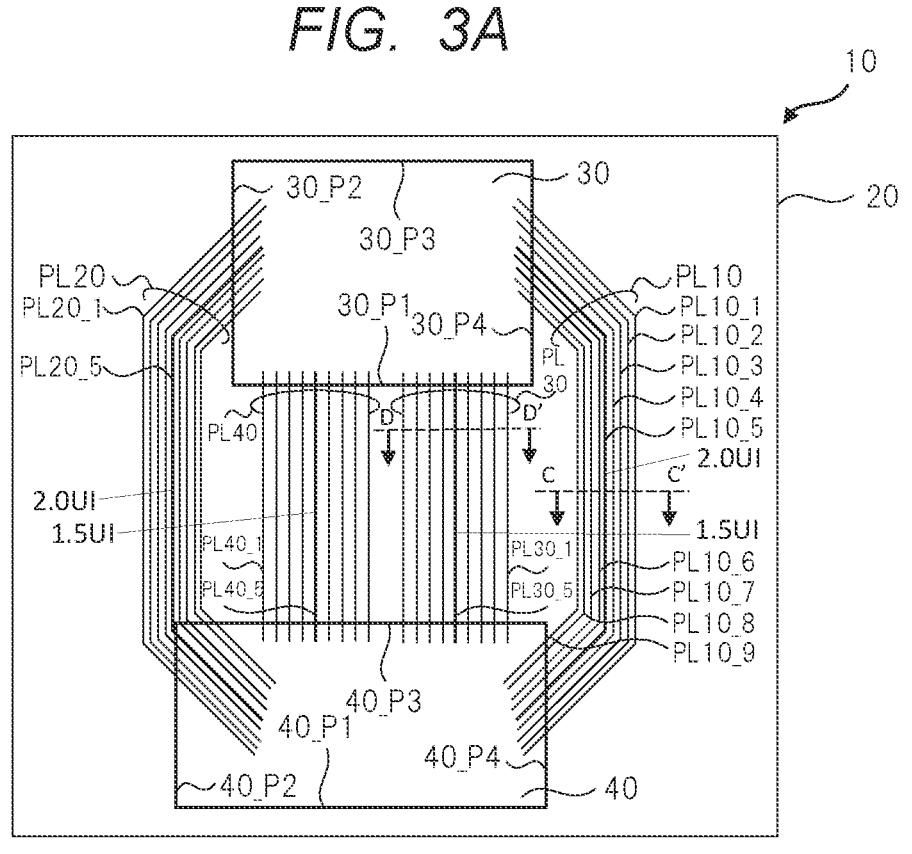
FIGS. 3A and 3B are a plan view and a cross-sectional view, respectively, each showing a configuration of an electronic device according to a second embodiment.
Figure 3B:
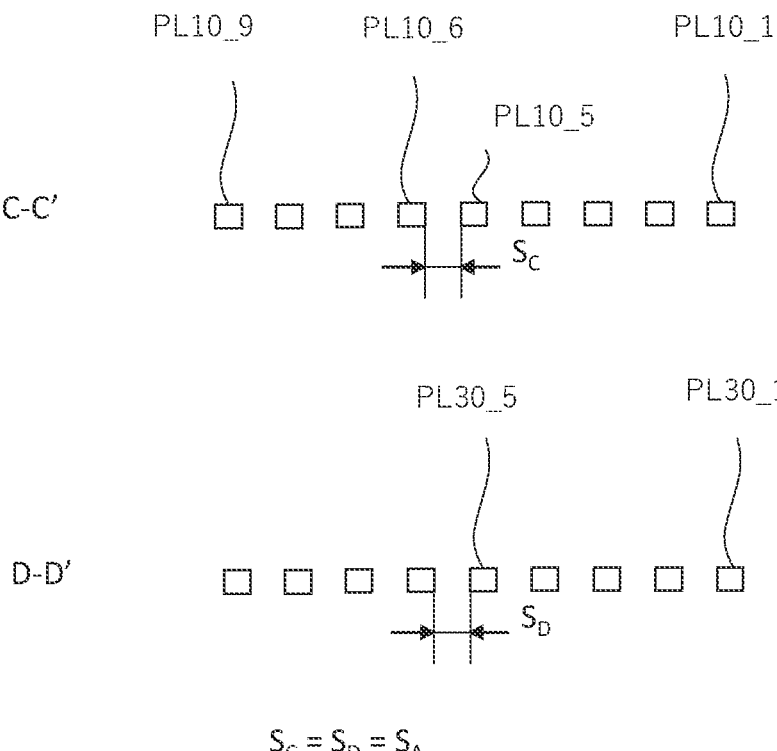

FIG. 3A and FIG. 3B are a plan view and a cross-sectional view, respectively, each showing a configuration of an electronic device according to the second embodiment. In FIG. 3A, "10" denotes a semiconductor device according to the second embodiment. In FIG. 3B, "C-C'" represents a cross section at the broken line portion C-C' shown in FIG. 3A, and "D-D'" represents a cross section at the broken line portion D-D' shown in FIG. 3A. FIG. 3A is similar to FIG. 1A, and FIG. 3B is similar to FIG. 1B.

The difference is that, in FIG. 3A, the substrate (interposer) 20 is mounted on the semiconductor chips 30 and 40 instead of semiconductor devices 3 and 4, and the wiring length of the wiring groups PL10~PL40 connecting the semiconductor chips 30 and 40 is shorter than that of the wiring groups PL1~PL4. In the semiconductor device 10 according to the second embodiment, the length of the wiring and the size of substrate are smaller than those of the electronic device 1, and the size of the semiconductor device 10 is substantially the same as, for example, the size of the semiconductor device 3 in FIG. 1A.

Although the wiring length and the size of substrate differ, the operation of semiconductor device 10 and the phenomena that can reduce the effects of the crosstalk signal are the same as those of the electronic device 1 according to the first embodiment, and thus detailed explanation thereof is omitted.

The semiconductor chip (hereinafter, also referred to as a first semiconductor chip) 30 is a microcomputer chip, and the semiconductor chip (hereinafter, also referred to as a second semiconductor chip) 40 is a memory chip. Although not shown in 3A, the semiconductor chips 30 and 40 each include an input/output unit as in the first embodiment. An equalizer is provided at an input of a receiving unit constituting the input/output unit. An equalizer may also be provided at the output of the transmitting unit configuring the input/output unit.

In the second embodiment, a memory chip that is the semiconductor chip 40 operates according to a signal standard LPDDR5 or a signal standard that is faster than LPDDR5X. A standard that is faster than the signal standard LPDDR5 or LPDDR5X has not yet been formally determined, but there is a signal standard LPDDR6/LPDDR7. The expected transmission rates of this signaling standard LPDDR6 and LPDDR7 are 12.8 Gbps and 25.6 Gbps. The parallel signal transmission is performed between the semiconductor chips 30 and 40 according to the transmission rate of the signal standard LPDDR6/LPDDR7.

Compared to the first embodiment, the transmission rate is higher, and therefore the wiring length corresponding to the signal-delay divisible by 0.5 UI is shorter than that of the first embodiment. The dielectric constant of the dielectric used for substrate 20 shall be 4.4 as in the first embodiment. In this case, the wiring length corresponding to one data signal time UI is 5.58 mm in the signal standard LPDDR6 and 2.79 mm in the signal standard LPDDR7.

The semiconductor chips 30 and 40 are connected to each other by the wiring groups PL10~PL40 arranged in substrate 20. When the wiring group PL10 is exemplified, the wiring group PL10 includes nine equal-length wirings PL10_1 to PL10_9 arranged in parallel to each other. One end of each of the wirings PL10_1 to PL10_9 is connected to the input/output unit of the semiconductor chip 30, and the other terminal thereof is connected to the input/output unit of the semiconductor chip 40.

Using the nine wirings PL10_1 to PL10_9, a data signal and a clock signal of 1 byte (8 bits) are transmitted in parallel between the semiconductor chips 30 and 40. Here, it is assumed that the clock signal is transmitted using the clock signal line PL10_5. In a case where the 1-bit data signal and the clock signal are represented by differential signals, each of the wirings PL10_1 to PL10_9 is configured by two wirings. The same applies to other wiring groups PL20~PL40.

In the illustrated 3A, the wiring length of the wiring is set so that the signal delay in the wiring constituting the wiring groups PL10~PL40 is divisible by 0.5 UI. In other words, for example, the wiring lengths of the wirings PL10_1 to PL10_9 are set to an integral multiple of the wiring length corresponding to 0.5 UI. Consequently, as shown in FIG. 3B, in the wiring composing the wiring groups PL10-PL40, the wiring intervals $S_C$ and $S_D$ adjacent each other are set to the optimum minimum-value $S_A$. By setting the wiring interval to the optimum minimum value, it is possible to reduce the area of the wiring region.

Modified Example

Figure 4A:
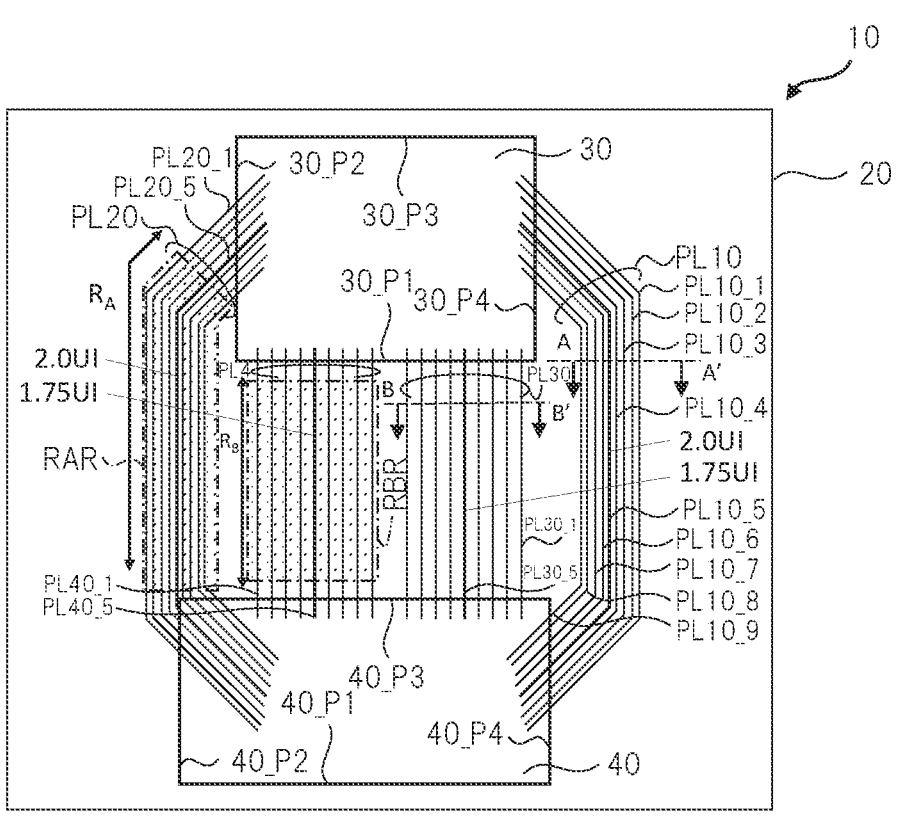
FIGS. 4A and 4B are a plan view and a cross-sectional view, respectively, each showing a configuration of an electronic device according to a modified example of the second embodiment.
Figure 4B:
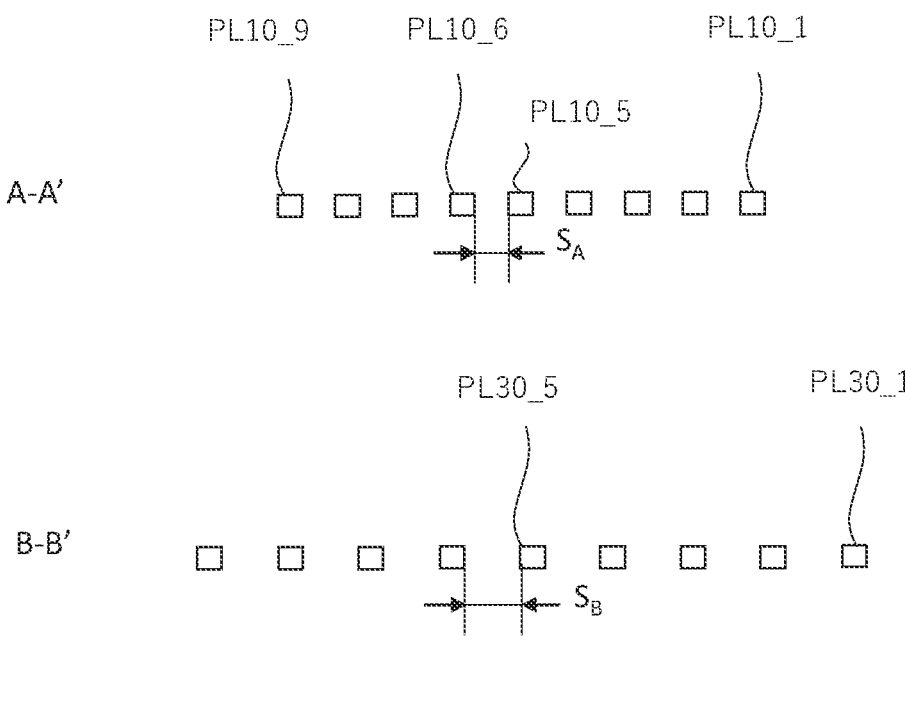

FIG. 4A and FIG. 4B are a plan view and a cross-sectional view, respectively, each showing a configuration of a semiconductor device according to a modified example of the second embodiment. Here, FIG. 4A is a plan view showing a configuration of the semiconductor device according to the modified example, and FIG. 4B is a cross-sectional view showing a cross section of the semiconductor device shown in FIG. 4A at a broken line portion A-A' and at a broken line portion B-B'. The FIGS. 4A and 4B are similar to FIGS. 3A and 3B. The differences are shown in FIGS. 4A and 4B where a signal delay of a wiring in wiring groups PL30 and PL40 is not divisible by 0.5 UI, similar to FIGS. 2A and 2B.

The wiring groups PL10 and PL20 are arranged to detour the outer side of the wiring groups PL30 and PL40 arranged in the central part of substrate 20. Therefore, the wiring length is set such that the signal delay of the wiring in the wiring groups PL10 and PL20 detouring the outside is divisible by 0.5 UI. Specifically, in the wiring in the central part, that is, in the wiring group disposed inside, the signal delay is a wiring length having a fraction of 0.25 UI.

In the outer wiring groups PL10 and PL20, since the signal delay is divisible by 0.5 UI, the wiring interval can be made as small as the wiring interval $S_A$ as shown in FIG. 4B. On the other hand, in the wiring groups PL30 and PL40 arranged inside, as shown in FIG. 3B, the wiring interval $S_B$ is relatively large. As compared with the wiring groups PL30, PL40 arranged on the inside, the wiring groups PL10, PL20 arranged on the outside has a longer wiring length, and thus the wiring groups PL10, PL20 on the outside easily consumes an occupied area. In modified example, since the wiring interval can be reduced in the outer wiring groups PL10, PL20, the entire area of the wiring area can be suppressed from increasing.

As described in FIGS. 2A and 2B, by maintaining the ratio of the wiring interval between the wiring groups at half or more of the total wiring length between the both ends of the wiring, the area of the wiring regions can be suppressed from increasing. In addition, preferably, when 63% or more of the wiring length or the ratio of the exceptional area to the wiring length is 10% to 20%, it is possible to suppress an increase in the area of the wiring area by maintaining the ratio of the wiring interval between the wiring groups at 70% to 79% or more of the wiring length excluding the exceptional area.

In the second embodiment as well, as in the first embodiment, the wiring interval can be reduced. In a semiconductor device to which the second embodiment is directed, the size is often controlled by the size of a semiconductor chip mounted on a substrate, the number of semiconductor chips, the terminals of packages, and the like, rather than the area of the wiring region. Therefore, it is considered that the reduction in the wiring interval contributes less to the downsizing of semiconductor device. However, by reducing the wiring interval, it is possible to arrange more wiring in the wiring area having the same area, thereby improving the signal bandwidth of the parallel signal transmitted between the semiconductor chips and improving the performance of semiconductor device.

In the second embodiment, the semiconductor chip 40 is a memory chip, but the semiconductor chip 40 may be sealed by a package. That is, a so-called PoP (Packege on Packege) mounting may be employed.

As can be understood from the above description in the column of <PHENOMENON FOUND BY PRESENT INVENTOR>, there is a phenomenon in which the effect of multiple crosstalk signals is periodically minimized by setting the wiring length so that the signal delay of the wiring is divisible by 0.5 UI. By using this phenomenon, for example, as described in the first embodiment, the wiring interval can be reduced by about 30%. As a result, it is possible to reduce the trade-off between the area of the wiring region and the number of wiring layers, thereby suppressing an increase in cost.

In the first embodiment and the second embodiment, the wiring length of the clock signal wiring for transmitting the clock signal is set so that the signal delay in the clock signal wiring for transmitting the clock signal is divided by half of the data signal time UI of the clock signal. In this case, the data signal wiring for transmitting a data signal such as a data system is set to be equal in length to the clock signal wiring for transmitting a clock signal, thereby reducing the influence of the crosstalk signal. According to the signal standard, since the data signal of the data system is synchronized with the clock signal, it is possible to set the wiring length of the wiring group capable of reducing the influence of the crosstalk signal only by setting the clock signal wiring.

However, of course, rather than a clock signal, for example, for data signal wiring for transmitting the data signal of the data system, the signal delay, so as to be divided by half the data signal time UI of the data signal of the data system, the wiring length it may be set.

Although the invention made by the present inventor has been specifically described based on the embodiment, the present invention is not limited to the embodiment described above, and it is needless to say that various modifications can be made without departing from the gist thereof.

What is claimed is:

1. An electronic device comprising:
    a substrate;
    a first semiconductor device mounted on the substrate, the first semiconductor device having a plurality of transmitting units;
    a second semiconductor device mounted on the substrate, the second semiconductor device having a plurality of receiving units; and
    a plurality of wirings formed in the substrate, the plurality of wirings coupling between the plurality of transmitting units and the plurality of receiving units, and the plurality of wirings transmitting a data signal from a corresponding one of the plurality of transmitting units to a corresponding one of the plurality of receiving units, wherein the plurality of wirings has:

a first wiring group; and a second wiring group different from the first wiring group, wherein the first wiring group has a plurality of first wirings, each of the plurality of first wirings having a signal delay that is divisible by a half of a time of the data signal;

wherein the second wiring group has a plurality of second wirings, each of the plurality of second wirings having a signal delay that is not divisible by the half of the time of the data signal;

wherein the plurality of first wirings is arranged in the substrate at a first wiring interval; and wherein the plurality of second wirings is arranged in the substrate at a second wiring interval wider than the first wiring interval.

2. The electronic device according to claim 1, wherein the plurality of first wirings has:

a first clock signal wiring transmitting a first clock signal as the data signal; and a first data signal wiring transmitting another data signal which is in synchronization with the first clock signal, wherein a wiring length of the first clock signal wiring is set as a length in which a signal delay of the first clock signal wiring is divisible by the half of the time of the data signal, wherein the plurality of second wirings has:

a second clock signal wiring transmitting a second clock signal as the data signal; and a second data signal wiring transmitting another data signal which is in synchronization with the second clock signal, and wherein a wiring length of the second clock signal wiring is set as a length in which a signal delay of the second clock signal wiring is not divisible by the half of the time of the data signal.

3. The electronic device according to claim 2, wherein the plurality of receiving units includes an equalizer coupled to a corresponding one of the plurality of wirings.

4. The electronic device according to claim 3, wherein a wiring length of each of the plurality of first wirings is longer than a wiring length of each of the plurality of second wirings.

5. The electronic device according to claim 4, wherein the first semiconductor device having the plurality of transmitting units is sealed in a first package, wherein the second semiconductor device having the plurality of receiving units is sealed in a second package different from the first package, wherein the first package and the second package are coupled with each other by way of the plurality of first wirings and the plurality of second wirings, and wherein, in plan view, the plurality of first wirings is arranged in the substrate so as to detour the plurality of second wirings.

6. The electronic device according to claim 5, wherein the second semiconductor device is a memory, and wherein a transmission rate of the data signal is 5 Gbps or more.

7. A semiconductor device comprising:

a substrate;

a first semiconductor chip mounted on the substrate, the first semiconductor chip having a plurality of transmitting units;

a second semiconductor chip mounted on the substrate, the second semiconductor chip having a plurality of receiving units; and a plurality of wirings formed in the substrate, the plurality of wirings coupling between the plurality of transmitting units and the plurality of receiving units, and the plurality of wirings transmitting a data signal from a corresponding one of the plurality of transmitting units to a corresponding one of the plurality of receiving units, wherein the plurality of wirings has:

a first wiring group; and a second wiring group different from the first wiring group, wherein the first wiring group has a plurality of first wirings, each of the plurality of first wirings having a signal delay that is divisible by a half of a time of the data signal;

wherein the second wiring group has a plurality of second wirings, each of the plurality of second wirings having a signal delay that is not divisible by the half of the time of the data signal;

wherein the plurality of first wirings is arranged in the substrate at a first wiring interval; and wherein the plurality of second wirings is arranged in the substrate at a second wiring interval wider than the first wiring interval.

8. The semiconductor device according to claim 7, wherein the plurality of first wirings has:

a first clock signal wiring transmitting a first clock signal as the data signal; and a first data signal wiring transmitting another data signal which is in synchronization with the first clock signal, wherein a wiring length of the first clock signal wiring is set as a length in which a signal delay of the first clock signal wiring is divisible by the half of the time of the data signal, wherein the plurality of second wirings has:

a second clock signal wiring transmitting a second clock signal as the data signal; and a second data signal wiring transmitting another data signal which is in synchronization with the second clock signal, and wherein a wiring length of the second clock signal wiring is set as a length in which a signal delay of the second clock signal wiring is not divisible by the half of the time of the data signal.

9. The semiconductor device according to claim 8, wherein the plurality of receiving units includes an equalizer coupled to a corresponding one of the plurality of wirings.

10. The semiconductor device according to claim 9, wherein a wiring length of each of the plurality of first wirings is longer than a wiring length of each of the plurality of second wirings.

11. The semiconductor device according to claim 10, wherein the first semiconductor chip and the second semiconductor chip are coupled with each other by way of the plurality of first wirings and the plurality of second wirings, and wherein, in plan view, the plurality of first wirings is arranged in the substrate so as to detour the plurality of second wirings.

12. The semiconductor device according to claim 11, wherein the second semiconductor device is a memory, and wherein a transmission rate of the data signal is 5 Gbps or more.

* * * * *